United States Patent
Groe et al.

(10) Patent No.: US 7,920,033 B1
(45) Date of Patent: Apr. 5, 2011

(54) SYSTEMS AND METHODS FOR FREQUENCY MODULATION ADJUSTMENT

(76) Inventors: John B. Groe, Poway, CA (US); Carrie Lo, San Diego, CA (US); Joseph Austin, San Diego, CA (US)

( * ) Notice: Subject to any disclaimer, the term of this patent is extended or adjusted under 35 U.S.C. 154(b) by 0 days.

(21) Appl. No.: 11/863,772

(22) Filed: Sep. 28, 2007

Related U.S. Application Data

(60) Provisional application No. 60/848,604, filed on Sep. 28, 2006.

(51) Int. Cl.
H03C 3/02 (2006.01)

(52) U.S. Cl. ............ 332/128; 332/118; 332/127

(58) Field of Classification Search ........ 331/23, 331/16, 34, 44, 36 C; 332/103, 117, 118, 332/119, 127, 128, 136; 375/308
See application file for complete search history.

(56) References Cited

U.S. PATENT DOCUMENTS

| | | |
|---|---|---|
| 4,263,560 A | 4/1981 | Ricker |
| 4,430,627 A | 2/1984 | Machida |
| 4,769,588 A | 9/1988 | Panther |
| 4,816,772 A | 3/1989 | Klotz |
| 4,926,135 A | 5/1990 | Voorman |
| 4,965,531 A | 10/1990 | Riley |
| 5,006,818 A | 4/1991 | Koyama et al. |
| 5,015,968 A | 5/1991 | Podell et al. |
| 5,030,923 A | 7/1991 | Arai |
| 5,289,136 A | 2/1994 | DeVeirman et al. |
| 5,331,292 A | 7/1994 | Worden et al. |
| 5,399,990 A | 3/1995 | Miyake |
| 5,491,450 A | 2/1996 | Helms et al. |
| 5,508,660 A | 4/1996 | Gersbach et al. |
| 5,548,594 A | 8/1996 | Nakamura |
| 5,561,385 A | 10/1996 | Choi |
| 5,581,216 A | 12/1996 | Ruetz |
| 5,625,325 A | 4/1997 | Rotzoll et al. |
| 5,631,587 A | 5/1997 | Co et al. |
| 5,648,744 A | 7/1997 | Prakash et al. |
| 5,677,646 A | 10/1997 | Entrikin |
| 5,739,730 A | 4/1998 | Rotzoll |
| 5,767,748 A | 6/1998 | Nakao |
| 5,818,303 A | 10/1998 | Oishi et al. |
| 5,834,987 A | 11/1998 | Dent |
| 5,862,465 A | 1/1999 | Ou |
| 5,878,101 A | 3/1999 | Aisaka |
| 5,880,631 A | 3/1999 | Sahota |
| 5,939,922 A | 8/1999 | Umeda |
| 5,945,855 A | 8/1999 | Momtaz |
| 5,949,286 A | 9/1999 | Jones |
| 5,990,740 A | 11/1999 | Groe |
| 5,994,959 A | 11/1999 | Ainsworth |
| 5,999,056 A | 12/1999 | Fong |
| 6,011,437 A | 1/2000 | Sutardja et al. |
| 6,018,651 A | 1/2000 | Bruckert et al. |
| 6,031,425 A | 2/2000 | Hasegawa |

(Continued)

*Primary Examiner* — Robert Pascal
*Assistant Examiner* — Ryan Johnson
(74) *Attorney, Agent, or Firm* — Blairtech Solution LLC

(57) ABSTRACT

A system and method for providing, among other things, wideband phase modulation is described. Several embodiments include a scaling network for scaling an input modulation signal in accordance with a scaling parameter and thereby generating a scaled modulation signal that is applied to a voltage-controlled oscillator of a phase-locked loop. A sensing network may also be included for detecting changes in one or more parameters characterizing the voltage-controlled oscillator. A calibration adjustment network may additionally be included for adjusting the scaling parameter in accordance with the changes in the one or more parameters.

18 Claims, 7 Drawing Sheets

System to Keep $\alpha K_{FM} v_{FM}$ Constant

U.S. PATENT DOCUMENTS

| | | |
|---|---|---|
| 6,044,124 A | 3/2000 | Monahan et al. |
| 6,052,035 A | 4/2000 | Nolan et al. |
| 6,057,739 A | 5/2000 | Crowley et al. |
| 6,060,935 A | 5/2000 | Shulman |
| 6,091,307 A | 7/2000 | Nelson |
| 6,100,767 A | 8/2000 | Sumi |
| 6,114,920 A | 9/2000 | Moon et al. |
| 6,163,207 A | 12/2000 | Kattner et al. |
| 6,173,011 B1 | 1/2001 | Rey et al. |
| 6,191,956 B1 | 2/2001 | Foreman |
| 6,204,728 B1 | 3/2001 | Hageraats |
| 6,211,737 B1 | 4/2001 | Fong |
| 6,229,374 B1 | 5/2001 | Tammone, Jr. |
| 6,246,289 B1 | 6/2001 | Pisati et al. |
| 6,255,889 B1 | 7/2001 | Branson |
| 6,259,321 B1 | 7/2001 | Song et al. |
| 6,288,609 B1 | 9/2001 | Brueske et al. |
| 6,298,093 B1 | 10/2001 | Genrich |
| 6,333,675 B1 | 12/2001 | Saito |
| 6,370,372 B1 | 4/2002 | Molnar et al. |
| 6,392,487 B1 | 5/2002 | Alexanian |
| 6,404,252 B1 | 6/2002 | Wilsch |
| 6,476,660 B1 | 11/2002 | Visocchi et al. |
| 6,515,553 B1 | 2/2003 | Filiol et al. |
| 6,559,717 B1 | 5/2003 | Lynn et al. |
| 6,560,448 B1 | 5/2003 | Baldwin et al. |
| 6,571,083 B1 | 5/2003 | Powell, II et al. |
| 6,577,190 B2 | 6/2003 | Kim |
| 6,583,671 B2 | 6/2003 | Chatwin |
| 6,583,675 B2 | 6/2003 | Gomez |
| 6,639,474 B2 | 10/2003 | Asikainen et al. |
| 6,664,865 B2 | 12/2003 | Groe et al. |
| 6,670,861 B1 * | 12/2003 | Balboni ............ 332/103 |
| 6,674,331 B2 * | 1/2004 | McDowell .......... 331/16 |
| 6,683,509 B2 | 1/2004 | Albon et al. |
| 6,693,977 B2 | 2/2004 | Katayama et al. |
| 6,703,887 B2 | 3/2004 | Groe |
| 6,711,391 B1 | 3/2004 | Walker et al. |
| 6,724,235 B2 | 4/2004 | Costa et al. |
| 6,734,736 B2 | 5/2004 | Gharpurey |
| 6,744,319 B2 | 6/2004 | Kim |
| 6,751,272 B1 | 6/2004 | Burns et al. |
| 6,753,738 B1 | 6/2004 | Baird |
| 6,763,228 B2 | 7/2004 | Prentice et al. |
| 6,774,740 B1 | 8/2004 | Groe |
| 6,777,999 B2 | 8/2004 | Kanou et al. |
| 6,781,425 B2 | 8/2004 | Si |
| 6,795,843 B1 | 9/2004 | Groe |
| 6,798,290 B2 | 9/2004 | Groe et al. |
| 6,801,089 B2 | 10/2004 | Costa et al. |
| 6,845,139 B2 | 1/2005 | Gibbons |
| 6,856,205 B1 | 2/2005 | Groe |
| 6,870,411 B2 | 3/2005 | Shibahara et al. |
| 6,870,430 B2 * | 3/2005 | Nakamura et al. ............ 331/18 |
| 6,917,791 B2 | 7/2005 | Chadwick |
| 6,940,356 B2 | 9/2005 | McDonald, II et al. |
| 6,943,600 B2 | 9/2005 | Craninckx |
| 6,975,687 B2 | 12/2005 | Jackson et al. |
| 6,985,703 B2 | 1/2006 | Groe et al. |
| 6,990,327 B2 | 1/2006 | Zheng et al. |
| 7,062,248 B2 | 6/2006 | Kuiri |
| 7,065,334 B1 | 6/2006 | Otaka et al. |
| 7,088,979 B1 | 8/2006 | Shenoy et al. |
| 7,123,102 B2 | 10/2006 | Uozumi et al. |
| 7,142,062 B2 | 11/2006 | Vaananen et al. |
| 7,148,764 B2 | 12/2006 | Kasahara et al. |
| 7,171,170 B2 | 1/2007 | Groe et al. |
| 7,215,215 B2 | 5/2007 | Hirano et al. |
| 2002/0071497 A1 | 6/2002 | Bengtsson et al. |
| 2002/0135428 A1 | 9/2002 | Gomez |
| 2002/0193009 A1 | 12/2002 | Reed |
| 2003/0078016 A1 | 4/2003 | Groe et al. |
| 2003/0092405 A1 | 5/2003 | Groe et al. |
| 2003/0118143 A1 | 6/2003 | Bellaouar et al. |
| 2003/0197564 A1 | 10/2003 | Humphreys et al. |
| 2004/0017862 A1 | 1/2004 | Redman-White |
| 2004/0051590 A1 | 3/2004 | Perrott et al. |
| 2005/0073371 A1 * | 4/2005 | Brett et al. ............ 331/74 |
| 2005/0093631 A1 | 5/2005 | Groe |
| 2005/0099232 A1 | 5/2005 | Groe et al. |
| 2006/0003720 A1 | 1/2006 | Lee et al. |

* cited by examiner

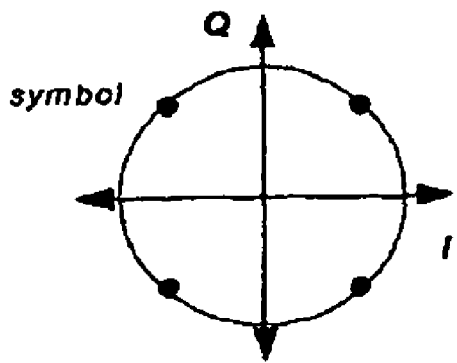
Figure 1. QPSK constellation diagram
— PRIOR ART —
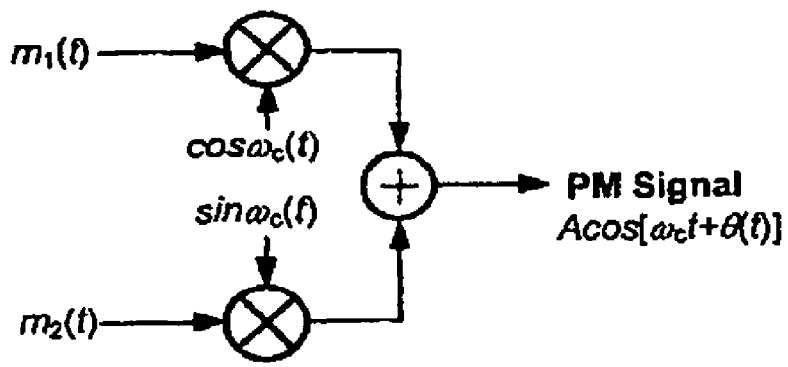
Figure 2. Typical I/Q modulator
— PRIOR ART —
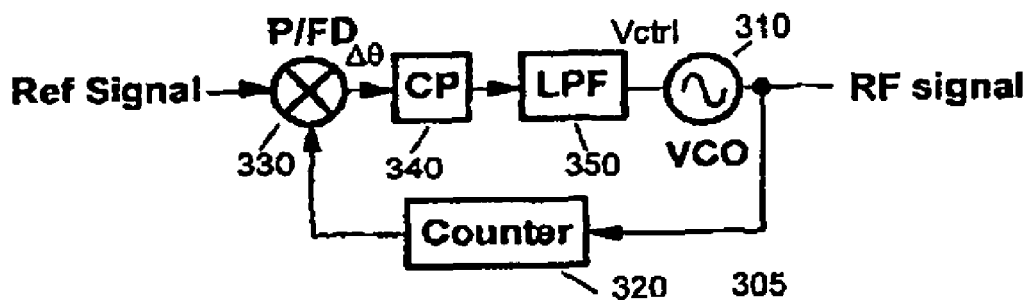
Figure 3. Conventional PLL
— PRIOR ART —

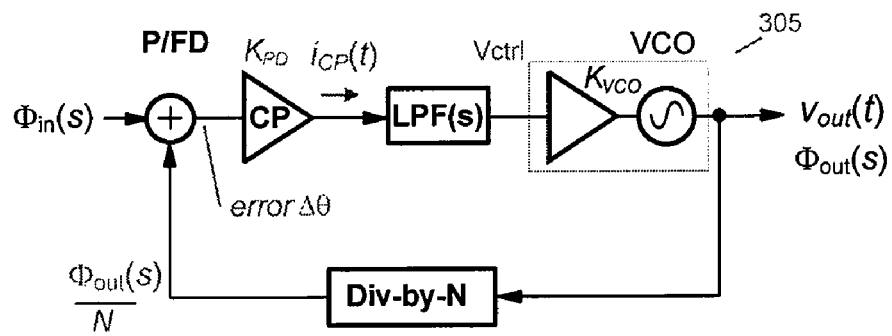
Figure 4. Mathematical Model of the PLL
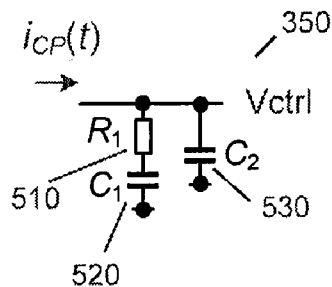
Figure 5. Integration Filter
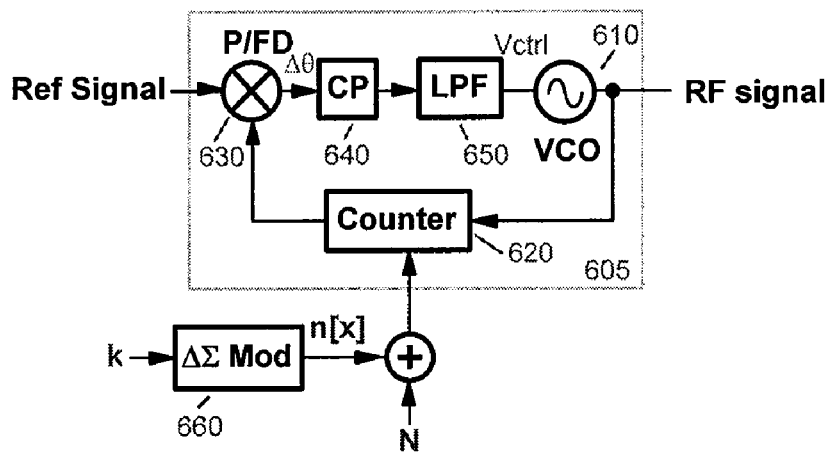
Figure 6. Fractional-N PLL using a ΔΣ modulator

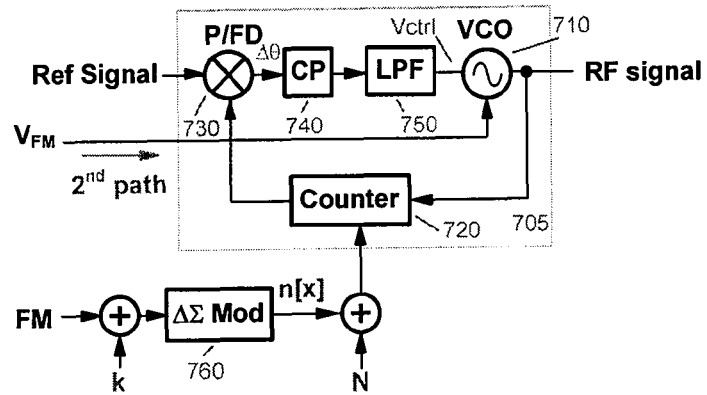
Figure 7. Direct Phase/Frequency Modulator
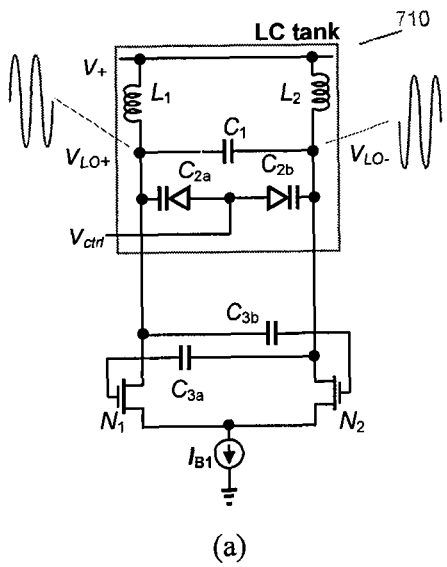
(a)
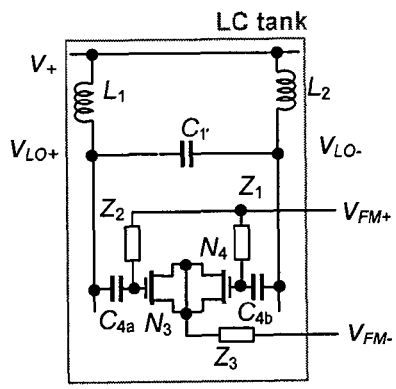
(b)
Figure 8. Voltage-Controlled Oscillator
a) Circuit Diagram and b) FM Port Details

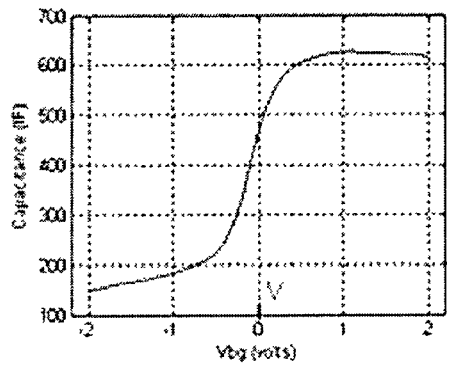
Figure 9. C-V Relationship for
Accumulation-Mode MOSFET Device
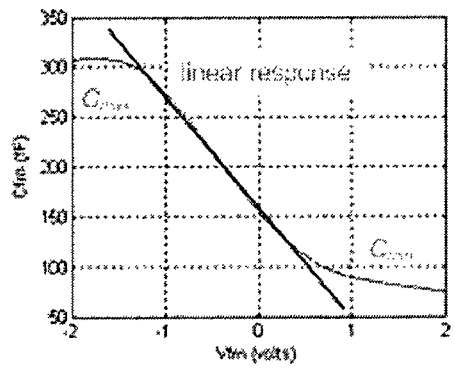
Figure 10. Behavior of the back-to-back
MOSFET Devices in VCO
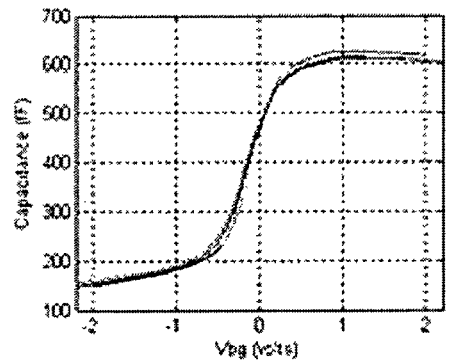
Figure 11. Temperature Sensitivity of C-V Relationship for
Accumulation-Mode MOSFET Device

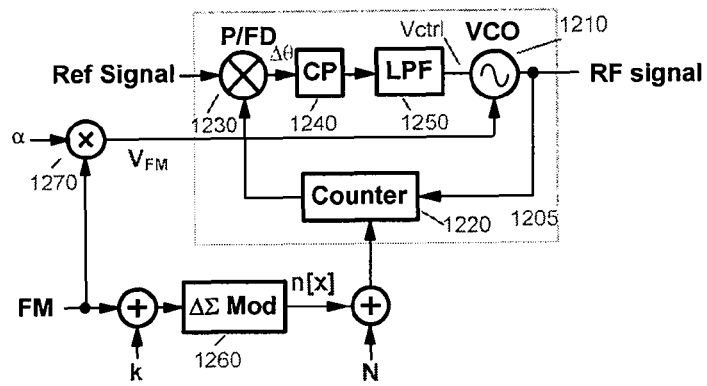
Figure 12. Direct Phase/Frequency Modulator Modified to Accurately Set the Gain of the Direct VCO Path
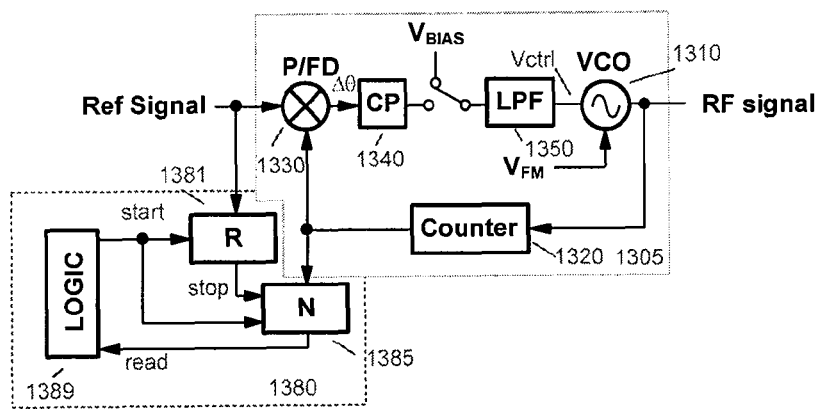
Figure 13. Calibration System to Measure $K_{FM}$
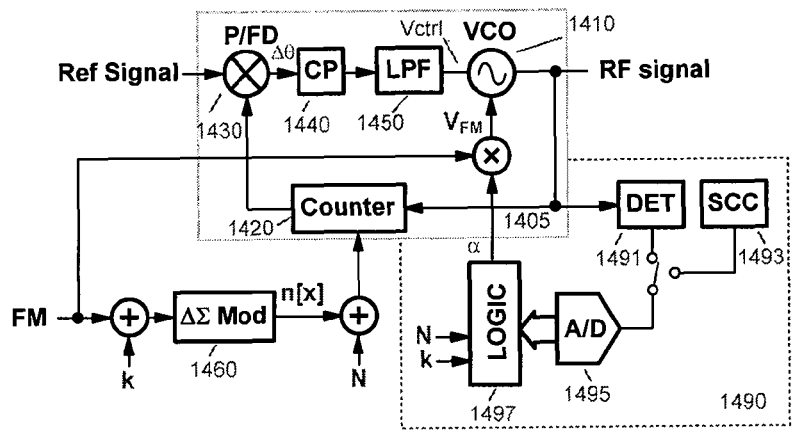
Figure 14. System to Keep $\alpha K_{FM} v_{FM}$ Constant

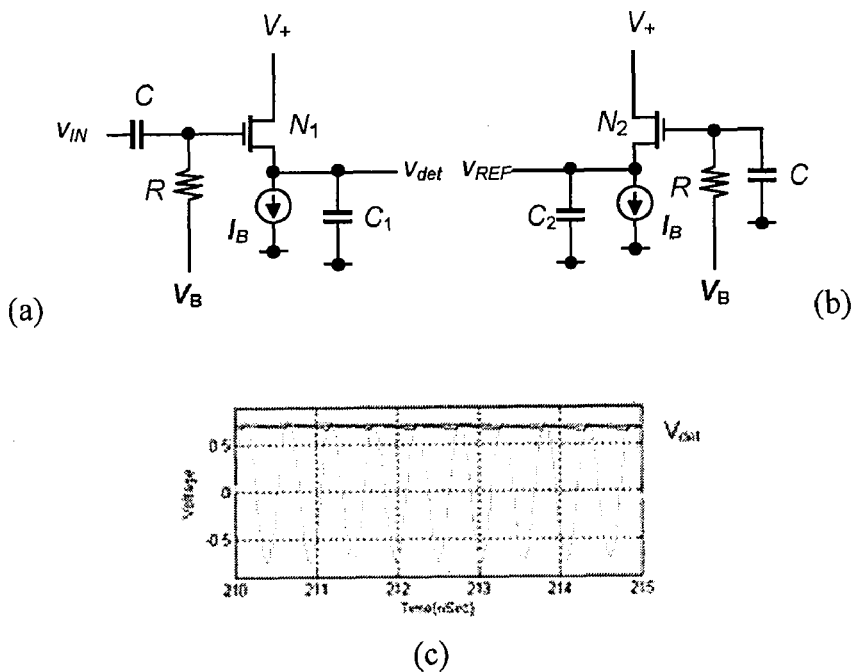
Figure 15. Peak Detector
(a) and (b) Circuit Diagram and (c) Output Signal
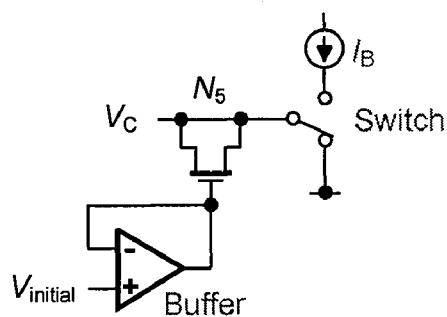
Figure 16. Swept Capacitance Circuit for Measuring C-V Response of Accumulation-Mode MOSFET Capacitor

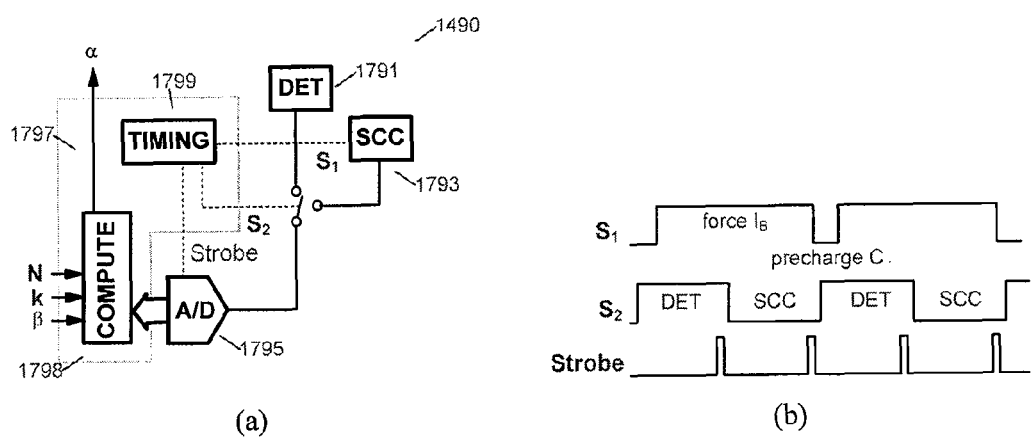
Figure 17. Controlling Logic for $K_{FM}$ Adjustment System:
a) Block Diagram and b) Timing Diagram

SYSTEMS AND METHODS FOR FREQUENCY MODULATION ADJUSTMENT

PRIORITY

The present application claims priority under 35 U.S.C. 119(e) to U.S. provisional application No. 60/848,604 entitled "$K_{fm}$ Adjustment," filed on Sep. 28, 2006.

CROSS-REFERENCE TO RELATED APPLICATIONS

This application relates to and incorporates by reference U.S. Pat. No. 6,985,703, entitled, "Direct Synthesis Transmitter," issued on Jan. 10, 2006, U.S. Pat. No. 6,774,740, entitled, "System for Highly Linear Phase Modulation," issued on Aug. 10, 2004, U.S. Pat. No. 7,061,341, entitled, "System for Highly Linear Phase Modulation," issued on Jun. 13, 2006, U.S. patent application Ser. No. 11/369,897, entitled, "Linear Wideband Phase Modulation System," filed on Mar. 5, 2006, and U.S. patent application Ser. No. 11/337,965 "System for Digital Calibration of Phase-Locked Loops," filed on Jan. 23, 2006.

FIELD OF THE INVENTION

The present invention relates generally to phase/frequency modulators, and more particularly, to an architecture for direct phase/frequency modulation of a phase-locked loop.

BACKGROUND OF THE INVENTION

Phase modulation schemes are very effective and are therefore widely used in communication systems. A simple example of a phase modulation scheme is quaternary phase shift keying (QPSK). FIG. 1 shows a constellation diagram that illustrates how QPSK maps two-bit digital data to one of four phase offsets. FIG. 2 shows a typical QPSK (or in-phase (I)/quadrature (Q)) modulator used to generate a phase-modulated signal. This technique relies on orthogonal signal vectors to realize the phase offsets—an inherently linear technique, since it depends solely on the matching of these orthogonal signals.

The I/Q modulator provides a straightforward approach to generating phase-modulated signals that is also suitable for more complex schemes such as wideband Code-Division Multiple Access (CDMA) and Orthogonal Frequency Division Multiplexing (OFDM) systems. It is also possible to generate the phase-modulated signals using a phase-locked loop (PLL). This approach offers reduced circuitry and lower power consumption and, as a result, finds widespread use in narrowband systems. A variation of this approach, known as two-point modulation, introduces direct modulation of the VCO to support wideband phase modulation, which unfortunately requires an accurate VCO gain. This requirement is a difficult task since the VCO gain depends on multiple factors. It would therefore be advantageous to accurately set the gain of the VCO.

SUMMARY OF THE INVENTION

A very efficient system for wideband phase modulation is provided. The system includes circuitry for periodically adjusting the gain of a voltage-controlled oscillator (VCO) used in a phase-locked loop (PLL) to synthesize the radio frequency modulated signal.

BRIEF DESCRIPTION OF THE DRAWINGS

The foregoing aspects and the attendant advantages of the embodiments described herein will become more readily apparent by reference to the following detailed description when taken in conjunction with the accompanying drawings wherein:

FIG. 1 shows a constellation diagram that illustrates how QPSK maps two-bit digital data to one of four offsets;

FIG. 2 shows a diagram of a typical I/Q modulator;

FIG. 3 shows a PLL that is used to synthesize a radio frequency carrier signal;

FIG. 4 shows a mathematical model of the PLL shown in FIG. 3;

FIG. 5 shows an integration filter;

FIG. 6 shows one embodiment of a fractional-N PLL using a $\Delta\Sigma$ modulator;

FIG. 7 illustrates one embodiment of a fractional-N PLL that supports direct frequency or phase modulation;

FIG. 8a shows a detailed view of a voltage-controlled oscillator;

FIG. 8b shows one embodiment of a VCO tank circuit that includes an auxiliary port to support linear phase/frequency modulation;

FIG. 9 shows the capacitance-voltage relationship for an accumulation-mode MOSFET device;

FIG. 10 shows the linear capacitance-voltage response from back to back MOSFET devices;

FIG. 11 shows the capacitance-voltage relationship for an accumulation-mode MOSFET device at different temperatures;

FIG. 12 illustrates a phase/frequency modulator with an adjustable VCO gain $K_{FM}$;

FIG. 13 shows a system for measuring the VCO gain $K_{FM}$;

FIG. 14 illustrates a phase/frequency modulator with accurate and constant VCO gain $K_{FM}$ in accordance with the present invention;

FIG. 15a shows circuitry associated with a peak detector circuit;\

FIG. 15b shows circuitry associated with a peak detector circuit that minimizes temperature effects;

FIG. 15c shows an output signal used by a peak detector circuit;

FIG. 16 shows a circuit for measuring the swept capacitance of the accumulation-mode MOSFET in accordance with the present invention; and FIG. 17a details the control logic used in the VCO gain $K_{FM}$ adjustment system of FIG. 14 in accordance with the present invention; and FIG. 17b shows a timing diagram for the control logic of FIG. 14 in accordance with the present invention.

DETAILED DESCRIPTION

FIG. 3 depicts a phase-locked loop (PLL) 305. The PLL 305 includes a voltage-controlled oscillator (VCO) 310, a feedback counter 320, a phase/frequency detector (P/FD) 330, a charge pump (CP) 340, and an integration filter (LPF) 350. Elements of the PLL 305 of FIG. 3 are described by the mathematical model shown in FIG. 4.

The PLL 305 uses feedback to minimize the phase difference between a very accurate reference signal and its output (RF) signal. As such, it produces an output signal at a frequency given by $$f_{VCO} = Nf_{REF}$$

where $f_{vco}$ is the frequency of the VCO 310 output signal, N is the value of the feedback counter 320, and $f_{REF}$ is the frequency of the reference signal.

The VCO 310 produces an output signal at a frequency set by the control voltage $v_{ctrl}$ according to $$v_{out}(t) = A\cos(\omega_o t + K_{vco}\int v_{ctrl}(t)dt),$$

where $\omega_o$ is the free-running frequency of the VCO 310 and $K_{vco}$ is the gain of the VCO 310. The gain $K_{vco}$ describes the relationship between the excess phase of the carrier $\Phi_{out}$ and the control voltage $v_{ctrl}$ with $$\frac{\Phi_{out}(S)}{v_{ctrl}(S)} = \frac{K_{vco}}{s},$$

where $K_{vco}$ is in rads/V. The VCO 310 drives the feedback counter 320, which simply divides the output phase $\Phi_{out}$ by N.

When the PLL 305 is locked, the phase detector 330 and charge pump 340 generate an output signal $i_{CP}$ that is proportional to the phase difference $\Delta\theta$ between the two signals applied to the phase detector 330. The output signal $i_{CP}$ can therefore be expressed as $$i_{CP}(s) = K_{pd}\frac{\Delta\theta(s)}{2\pi},$$

where $K_{pd}$ is in A/radians and $\Delta\theta$ is in radians.

FIG. 5 depicts an integration filter 350 comprising a resistor $R_1$ 510 and capacitors $C_1$ 520 and $C_2$ 530. As shown, the integration filter 350 transforms the output signal $i_{CP}$ to the control voltage $v_{ctrl}$ as follows $$v_{ctrl}(s) = i_{out}(s)\left(\frac{sR_1C_1 + 1}{s^2R_1C_1C_2 + s(C_1 + C_2)}\right),$$

where a zero (e.g., at $1/R_1C_1$) has been added to stabilize the second order system and the capacitor $C_2$ 530 has been included to reduce any ripple on the control voltage $v_{ctrl}$. Combining the above relations yields the closed-loop response of the system to an input signal $$T_1(s) = \frac{NK_{PD}K_{VCO}Z(s)}{sN + K_{PD}K_{VCO}Z(s)}.$$

The value N of the feedback counter 320 sets the output frequency of the PLL 305. Its digital structure restricts N to integer numbers. As a result, the frequency resolution (or frequency step size) of the integer-N PLL 305 is nominally set by $f_{REF}$. Fortunately, it's possible to dramatically decrease the effective frequency step by manipulating the value of N to yield a non-integer average value. This is the concept of a fractional-N PLL.

FIG. 6 depicts a fractional-N PLL 605 that uses a $\Delta\Sigma$ modulator 660 to develop non-integer values of N. The $\Delta\Sigma$ modulator 660 advantageously pushes spurious energy (created by the changing values of the feedback counter 620) to higher frequencies to be more effectively attenuated by the integration filter 650. It can be shown that the effective value of N is simply the average value described by $$N = \frac{\sum_{x=1}^{P} N[x]}{P},$$

where $N[x]$ is the sequence of values of the feedback counter 620. This expands to $$N[x] = N_{int} + n[x],$$

where $N_{int}$ is the integer part and $n[x]$ is the fractional part of $N[x]$. The $\Delta\Sigma$ modulator 660 generates the sequence $n[x]$, that satisfies $$\frac{\sum_{x=1}^{P} n[x]}{P} = \frac{k}{M},$$

where k is the input to the $\Delta\Sigma$ modulator 660 with resolution M. In practice, the order of the $\Delta\Sigma$ modulator 660 dictates the range of $n[x]$.

The $\Delta\Sigma$ modulator 660 introduces quantization noise that appears at the PLL 605 output. The pseudo-random sequence $n[x]$ possessing a quantization error approximately equal to $\pm\frac{1}{2}$ N or $$\Delta = \frac{1}{N}.$$

It follows that the quantization noise spectral density for this error, assuming a uniform distribution, is expressed by $$e_{rms}^2(f) = \frac{1}{6N^2 f_{REF}}.$$

over the frequency range of dc to $f_{REF}/2$. This quantization noise is advantageously shaped by an $L^{th}$ order $\Delta\Sigma$ modulator 660 according to $$DS(z) = (1 - z^{-1})^L.$$

In the PLL 605, the feedback counter 620 acts as a digital accumulator and reduces the effects of the $\Delta\Sigma$ modulator 660. That is, the output phase from the feedback counter 620 depends on its previous output phase. The transfer function for the feedback counter 620 is therefore $$P(z) = 2\pi\frac{z^{-1}}{1 - z^{-1}}.$$

Combining these terms shows that the output noise of the feedback counter 620 is equal to $$n^2(f) = e_{rms}^2(f)[DS(f)]^2[P(f)]^2,$$

which yields $$n^2(f) = \frac{2}{3}\frac{\pi^2}{N^2 f_{REF}}\left[2\sin\left(\frac{\pi f}{f_{REF}}\right)\right]^{2(L-1)}$$

This noise seen at the output of the feedback counter 620 is in turn shaped by the transfer function $T_1(s)$ of the PLL 605 presented above.

FIG. 7 depicts a fractional-N PLL 705 configured for very efficient phase/frequency modulation. The signals applied to the input control of the ΔΣ modulator 760 modulate the frequency of the VCO 710 according to $$f_{VCO} = f_c + \Delta f(t) = (N_{in}.n[x])f_{REF},$$

where $\Delta f(t)$ is the frequency modulation equal to $$\Delta f(t) = \left(n[x] - \frac{k}{M}\right)f_{REF} = FMf_{REF},$$

and FM is the applied modulation signal. In practice, the modulation is shaped by the response of the PLL 705 described by transfer function $T_1(s)$ described above. The response generally limits the bandwidth of the PLL 705 so as to attenuate the quantization noise of the ΔΣ modulator 760. Consequently, this phase/frequency modulation approach supports only narrowband signals.

To overcome the narrow bandwidth limitation, a second high-frequency modulation path is added to the PLL 705 and the VCO 710. The resulting two-point frequency modulation system of FIG. 7 displays a second and complimentary transfer function given by $$T_2(s) = \frac{sNK_{FM}}{sN + K_{PD}K_{VCO}Z(s)} v_{FM},$$

where $K_{FM}$ is the gain of the FM port of the VCO 710 at which the $v_{FM}$ modulating signal is applied. Ideally, the $T_1(s)$ and $T_2(s)$ expressions combine to yield a constant response, which occurs when $$FMf_{REF} = K_{FM}v_{FM}.$$

The challenge with two-point modulation, and more-specifically direct VCO modulation, is that it requires near-exact control of both the frequency of the VCO 710 and consequently the product $K_{FM}v_{FM}$ because frequency errors produce phase deviations that accumulate with time. Fortunately, the feedback of the PLL 705 reduces frequency errors because the output of the VCO 710 is driven by the feedback of the PLL 705 to $$f_{vco} = Nf_{REF} + FMf_{REF}$$

which is also equal to $$f_{VCO} = K_{VCO}v_{ctrl} + K_{FM}v_{FM}.$$

where $v_{ctrl}$ is an error signal produced by the P/F D 730 and $v_{FM}$ is an FM signal applied to the VCO 710. The error signal $v_{ctrl}$ compensates for any gain errors of the VCO 710 within the bandwidth of the integration filter 750. Outside the bandwidth of the PLL 705 the effect of the feedback decreases, which makes setting the gain $K_{FM}$ of the VCO 710 ("VCO gain $K_{FM}$") to its designed value a critical operation. Additionally, setting the gain $K_{FM}$ to its designed value ensures that a wider bandwidth can achieve better modulation accuracy. The VCO gain $K_{FM}$ depends heavily on the circuit structure of the VCO 710, which is described in more detail below.

A detailed view of the VCO 710 is shown in FIG. 8a. The VCO 710 oscillates at a frequency $$f_{osc} = \frac{1}{2\pi\sqrt{(L_1 + L_2)C_{eq}}},$$

which is set by the resonance of a VCO tank circuit shown in FIG. 8a, where $C_{eq}$ is the equivalent shunt capacitance (comprised of capacitor $C_1$ and varactors $C_{2a}$-$C_{2b}$ plus any parasitic capacitance). The equivalent capacitance $C_{eq}$ may also include coarse-tuning capacitors (not shown) to subdivide the tuning range. The varactor $C_2$ (shown as $C_{2a}$ and $C_{2b}$) allows the VCO 710, by way of the control signal $v_{ctrl}$, to be tuned to different radio frequencies.

A VCO tank circuit shown in FIG. 8b includes an auxiliary port to support linear phase/frequency modulation. The circuit uses the capacitance of accumulation-mode MOSFET devices to achieve linear behavior even though these devices display an abrupt response as illustrated in chart 900 of FIG. 9. The accumulation-mode MOSFET devices present a low capacitance $C_{min}$ at applied gate-to-bulk voltages $V_{GB}$ below the threshold voltage $V_T$, and the MOSFET devices display a high capacitance $C_{max}$ at applied voltages above $V_T$. Capacitors $C_{4a}$ and $C_{4b}$ block the dc level present at the output of the VCO 710. Resistors $Z_1$-$Z_3$ provide some isolation between the gates of MOSFET devices $N_3$ and $N_4$.

The gate-to-bulk voltage $V_{GB}$ applied to each MOSFET device depends on the output signal A sin ωt of the VCO 710, the FM signal $v_{FM}$, and the common-mode voltage $v_{cm}$. The symmetric structure of the VCO 710 provides that signals $V_{LO+}$ and $V_{LO-}$ are differential with $$V_{LO+} = A \sin \omega t\ \&\ V_{LO-} = -A \sin \omega t,$$

where A is the peak signal of each sinusoidal output and ω is the oscillation frequency. It follows then that $$V_{C3} = A \sin \omega t + v_{FM} - v_{cm}\ \&\ V_{C4} = -A \sin \omega t + v_{FM} - v_{cm},$$

which describe the gate-to-bulk voltages $V_{GB}$ applied to MOSFET devices $N_3$ and $N_4$. The two MOSFET devices $N_3$ and $N_4$ connect back-to-back in the VCO 710, so their individual capacitances behave oppositely.

The modulation signal $v_{FM}$ affects the MOSFET devices $N_3$ and $N_4$ as follows. The devices nominally present a capacitance equal to $$C_{mid} = C_{FM}(v_{FM} = 0) = \frac{C_{min}C_{max}}{C_{min} + C_{max}}.$$

As the FM signal $v_{FM}$ moves positive, both MOSFET devices $N_3$ and $N_4$ reach their maximum capacitance values $C_{max}$, so that for a period of time of approximately $$t = \frac{1}{\omega}\sin^{-1}\left(-\frac{v_{FM}}{A}\right),$$

the VCO structure in FIG. 8b presents a capacitance equal to $C_{max}/2$. A similar response occurs as the FM signal moves negative, which results in the VCO structure in FIG. 8b presenting a capacitance equal to $C_{min}/2$. It is worth noting that the VCO structure in FIG. 8b linearizes the overall response of the accumulation-mode MOSFET devices $N_3$ and $N_4$ to yield the behavior shown in capacitance curve 1000 of FIG. 10.

The capacitance curve 1000 shifts with the amplitude of signal A of the VCO 710 because this signal dynamically biases each accumulation-mode MOSFET device $N_3$ and $N_4$ and sweeps each MOSFET device $N_3$ and $N_4$ through a range of capacitance values. As the amplitude of signal A increases, the sensitivity of the back-to-back MOSFET devices $N_3$ and $N_4$ (e.g., $\Delta C/\Delta v_{FM}$) decreases.

In practice, the capacitance curve 1000 for each MOSFET device $N_3$ and $N_4$ shifts with temperature as shown in chart 1100 of FIG. 11. This affects $C_{min}$ and $C_{max}$ as well as the transition region between $C_{min}$ and $C_{max}$. It follows that the effective capacitance and the sensitivity of the back-to-back MOSFET devices $N_3$ and $N_4$ (e.g., $\Delta C/\Delta v_{FM}$) also changes.

Even if the sensitivity of the back-to-back MOSFET devices $N_3$ and $N_4$ remains constant, the VCO gain $K_{FM}$ may still change, as explained in the following. The VCO 710 oscillates at the resonant frequency of the VCO tank circuit shown in FIG. 8b. This resonant frequency is given by $$f_{osc} = \frac{1}{2\pi\sqrt{(L_1+L_2)(C_T+\Delta C)}} = f_c + \Delta f,$$

where $C_T$ is the total tank capacitance less the variable capacitance $\Delta C$. The frequency step $\Delta f$ due to a change in a MOSFET device capacitance $\Delta C$ is approximately equal to $$\Delta f = f_C\left[1 - \frac{1}{2}\frac{\Delta C}{C_T} + \frac{3}{8}\left(\frac{\Delta C}{C_T}\right)^2\right]$$

for small values of $\Delta C$. The frequency step $\Delta f$ simplifies to $$\Delta f = f_C\left(-\frac{1}{2}\frac{\Delta c}{C_T}\right),$$

which can then be rewritten as $$\Delta f = 2\pi^2 L f_C^3 \Delta C,$$

showing that $\Delta f$ changes as the third power of $f_C$. Consequently, setting the VCO gain $K_{FM}$ accurately is a challenging task.

FIG. 12 depicts a phase/frequency modulator 1270 that can accurately set the VCO gain $K_{FM}$. The system of FIG. 12 scales the FM signal $v_{FM}$ by $\alpha$ to compensate for variations in the VCO gain $K_{FM}$ and thereby stabilizes the $K_{FM}v_{FM}$ product such that $$FMf_{REF} = \alpha K_{FM}v_{FM}.$$

The value of $\alpha$ is calculated using a calibration system 1380 shown in FIG. 13. The gain $K_{FM}$ of the VCO 1310 is represented by the expression $$K_{FM} = \frac{\Delta f_{OUT}}{\Delta v_{FM}},$$

where $\Delta f_{OUT}$ is the difference between output frequencies $f_{VCO1}$ and $f_{VCO2}$ at two $v_{FM}$ inputs. Each of the output frequencies $f_{VCO1}$ and $f_{VCO2}$ is measured by $$f_{VCO} = \frac{N}{R}f_{REF},$$

where N is the number of cycles of the VCO 1310 during a fixed measurement period and R is the number of cycles of the reference signal. During operation of the calibration system 1380, a zero-phase restart signal initiates the R counter 1381 and N counter 1385 at the same time. Since the VCO 1310 operates independently of and at a higher frequency than the reference signal, the operation of the restart signal introduces an error in the frequency measurement of the output frequencies $f_{VCO1}$ and $f_{VCO2}$ equal to $$\Delta f_{VCO} = \frac{\Delta N}{R}f_{REF},$$

where $\Delta N$ represents an uncertainty associated with the N counter 1385 and the VCO 1310. The error $\Delta f_{VCO}$ is also compounded by the read operation of the N counter 1385 at the end of the measurement period, because at least a portion of the N counter 1385 is integrated with the PLL 1305 and is therefore not designed to stop instantly, nor is it designed to transfer its contents readily. Consequently, the uncertainty $\Delta N$ and the measurement error $\Delta f_{VCO}$ increases.

The accuracy of the above technique described with respect to FIG. 13 can be improved by increasing the length of the measurement period, which is accomplished by extending the measurement periods of the R counter 1381 and the N counter 1385 beyond the normal requirements of the PLL 1305. As a result of such an extension, it is possible to reduce the measurement error $\Delta f_{VCO}$ to less than a few tenths of a percent.

The calibration approach described above operates off-line (e.g., with a transmitter powered off), and occurs regularly in half duplex systems, but occurs infrequently in full duplex systems. Consequently, another calibration approach is needed to measure $K_{FM}$ and adjust a accordingly.

FIG. 14 depicts a $K_{FM}$ adjustment system 1490 that is configured to adjust a in order to keep $\alpha K_{FM}v_{FM}$ constant. The adjustment system 1490 tracks key parameters to predict $K_{FM}$ changes, and adjusts $\alpha$ accordingly. The adjustment system 1490 includes both a peak detector 1491 that measures the amplitude of the output signal of the VCO 1410, and a novel swept capacitance circuit (SCC) 1493 that characterizes the capacitance curve of an accumulation-mode MOSFET capacitor. The adjustment system 1490 translates the measurements received from the peak detector 1491 and the SCC 1493 to a digital format using an A/D converter 1495, and processes the data (via a logic device 1497) to determine the appropriate $\alpha$ value using $$\alpha_2 = \alpha_1\left(\frac{A_2}{A_1}\right)\left(\frac{f_1}{f_2}\right)^3\left(\beta + \frac{V_{C1}}{V_{C2}}\right),$$

where $\beta$ is a scaling factor that depends on the measurement from the SCC 1493.

FIGS. 15a-b depict circuitry associated with the peak detector 1491. The peak detector 1491 is associated with an RF detector circuit shown in FIG. 15a and a reference network shown in FIG. 15b that reduces temperature sensitivity. The output signal of the VCO 1410 ("VCO output signal")

couples to the detector input $v_{IN}$, and drives transistor $N_1$. Transistor $N_1$ rectifies the input signal according to $$i_{D1} = \frac{\mu C_{ox}}{2} \frac{W}{L} (v_{IN} + V_B - V_T - v_{det})^2,$$

where $i_{D1}$, $\mu$, $C_{OX}$, W, L, and $V_T$ are all well-known parameters associated with the transistor $N_1$, $V_B$ is the gate bias voltage, $v_{det}$ is the output voltage developed across capacitor $C_1$, and $v_{IN}$ has an amplitude $\kappa A$, where $\kappa$ is a fixed coupling factor.

The peak detector 1491 is configured to achieve equilibrium, where the average current flowing through transistor $N_1$ is $I_B$. Achieving equilibrium requires that the voltage held by capacitor $C_1$ tracks the positive peaks of the coupled VCO output signal which is shown in the graph provided by FIG. 15c. As a result, the amplitude of the VCO output signal is held by capacitor $C_1$. Transistor $N_2$ replicates the dc operation of the RF detector and provides a temperature compensated reference $V_{REF}$. The difference, $$V_{OUT} = v_{det} - V_{REF},$$

corresponds to $\kappa A$ and changes proportional to A.

In several embodiments, the peak detector 1491 can be eliminated if a feedback loop (not shown) exists to control the amplitude of the VCO output signal. Nevertheless, in several embodiments the VCO 1410 is designed to minimize amplitude changes of the VCO output signal.

FIG. 16 shows circuitry of the SCC 1493. As shown, the SCC 1493 forces a constant current $I_B$ through an accumulation-mode MOSFET device $N_5$, thus charging the nonlinear capacitance of the MOSFET device $N_5$. It follows that the developed voltage $V_C$ relates to the capacitance curve of the MOSFET device $N_5$ since $$V_C = \int_T \frac{I_B}{C_{MOS}(V_C)} dt + V_{initial},$$

where T corresponds to the period of time that the constant bias current $I_B$ charges $C_{MOS}$, the voltage-dependent capacitance of the MOSFET device, from an initial voltage $V_{initial}$. As a result, the voltage developed across the MOSFET device sweeps from $V_{initial}$ to $V_C$ similar to the way the VCO signal develops across the MOSFET device in the VCO circuit shown in FIG. 8b. It follows that $V_C$ represents a swept capacitance of the MOSFET device $N_5$. As such, with $I_B$ and T fixed, any differences in the MOSFET capacitance curve produce a new $V_C$ voltage.

FIG. 17 depicts logic circuitry of the $K_{FM}$ adjustment system 1490. As shown, the logic device 1797 strobes the A/D converter 1795 and samples the analog results from both the peak detector 1791 and the SCC 1793. The logic device 1797 includes a computing device 1798 that applies mathematical functions to determine the adjusted value of α. The logic device 1797 also includes a timing network 1799 to control the timing of the measurements from the peak detector 1791 and the SCC 1793, which occur based on the expected rate of change for $K_{FM}$. For example, FIG. 17b illustrates a timing diagram representative of operation of the timing network 1798 in one embodiment of the invention.

The innovative system described herein addresses a critical issue associated with two-point phase/frequency modulation systems. It advantageously ensures that the gain of the direct VCO modulation path is set properly and constant.

Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A compensation apparatus for use with a phase-locked loop, the compensation apparatus comprising:
   a scaling network configured to scale an input modulation signal in accordance with a scaling parameter and thereby generate a scaled modulation signal, the scaled modulation signal being applied to a voltage-controlled oscillator of the phase-locked loop;
   a sensing network configured to detect changes in one or more parameters characterizing the voltage-controlled oscillator; and
   a calibration adjustment network configured to adjust the scaling parameter in accordance with the changes in the one or more parameters, wherein the calibration adjustment network comprises:
   a peak detector circuit configured to measure an amplitude of an output signal of the voltage-controlled oscillator; and
   a swept capacitance circuit configured to release a control signal for adjusting the scaling parameter.

2. The compensation apparatus of claim 1, wherein the scaling network includes a frequency modulation signal multiplier component having an output coupled to a frequency modulation port of the voltage-controlled oscillator, wherein the frequency modulation signal multiplier component multiplies a frequency modulation signal by the scaling parameter to achieve a modified frequency modulation signal, the modified frequency modulation signal being released by the output of the frequency modulation signal multiplier component and received by the frequency modulation port of the voltage-controlled oscillator.

3. The compensation apparatus of claim 1, wherein the one or more parameters include a product of the frequency gain and a frequency modulation signal received by a frequency modulation port of the voltage-controlled oscillator.

4. A compensation apparatus for use with a phase-locked loop, the compensation apparatus comprising:
   a scaling network configured to scale an input modulation signal in accordance with a scaling parameter and thereby generate a scaled modulation signal, the scaled modulation signal being applied to a voltage-controlled oscillator of the phase-locked loop;
   a sensing network configured to detect changes in one or more parameters characterizing the voltage-controlled oscillator; and
   a calibration adjustment network configured to adjust the scaling parameter in accordance with the changes in the one or more parameters, wherein the calibration adjustment network comprises:
   a switch configured to release a constant current;
   a first transistor configured to receive the constant current, wherein the constant current charges the capacitance of the first transistor to a first series of capacitance levels that is related to a second series of capacitance levels associated with a second transistor belonging to the voltage-controlled oscillator; and
   an output port configured to release a control signal for adjusting the scaling parameter.

5. The compensation apparatus of claim 1, wherein the scaling network includes a frequency modulation signal multiplier component having an output coupled to a frequency modulation port of the voltage-controlled oscillator, wherein the frequency modulation signal multiplier component multiplies a frequency modulation signal by the scaling parameter to achieve a modified frequency modulation signal, the modified frequency modulation signal being released by the output of the frequency modulation signal multiplier component and received by the frequency modulation port of the voltage-controlled oscillator.

6. The compensation apparatus of claim 4, wherein the one or more parameters include a product of the frequency gain and a frequency modulation signal received by a frequency modulation port of the voltage-controlled oscillator.

7. A compensation apparatus for use with a phase-locked loop, the compensation apparatus comprising:
  a scaling network configured to scale an input modulation signal in accordance with a scaling parameter and thereby generate a scaled modulation signal, the scaled modulation signal being applied to a voltage-controlled oscillator of the phase-locked loop;
  a sensing network configured to detect changes in one or more parameters characterizing the voltage-controlled oscillator; and
  a calibration adjustment network configured to adjust the scaling parameter in accordance with the changes in the one or more parameters, wherein the calibration adjustment network comprises:
    a detector component responsive to an input signal, the detector component including a transistor which rectifies the input signal so as to generate a detection signal;
    a reference component configured to provide a temperature-compensated reference signal; and
    an output port for providing a temperature-compensated output signal corresponding to a difference between the detection signal and the temperature compensated reference signal.

8. The compensation apparatus of claim 7, wherein the scaling network includes a frequency modulation signal multiplier component having an output coupled to a frequency modulation port of the voltage-controlled oscillator, wherein the frequency modulation signal multiplier component multiplies a frequency modulation signal by the scaling parameter to achieve a modified frequency modulation signal, the modified frequency modulation signal being released by the output of the frequency modulation signal multiplier component and received by the frequency modulation port of the voltage-controlled oscillator.

9. The compensation apparatus of claim 7, wherein the one or more parameters include a product of the frequency gain and a frequency modulation signal received by a frequency modulation port of the voltage-controlled oscillator.

10. A method for adjusting a frequency gain of a voltage-controlled oscillator of a phase-locked loop, the method comprising:
  scaling an input modulation signal in accordance with a scaling parameter and thereby generating a scaled modulation signal;
  applying the scaled modulation signal to the voltage-controlled oscillator;
  detecting changes in one or more parameters characterizing the voltage-controlled oscillator;
  adjusting the scaling parameter in accordance with the changes in the one or more parameters; and
  releasing a constant current that charges a capacitance of a first transistor to a first series of capacitance levels related to a second series of capacitance levels associated with a second transistor of the voltage-controlled oscillator.

11. The method of claim 10, further comprising:
  multiplying a frequency modulation signal by the scaling parameter to achieve a modified frequency modulation signal; and
  inputting the modified frequency modulation signal to a frequency modulation port of the voltage-controlled oscillator.

12. The method of claim 10, wherein the one or more parameters include a product of the frequency gain and a frequency modulation signal associated with the voltage-controlled oscillator.

13. A method for adjusting a frequency gain of a voltage-controlled oscillator of a phase-locked loop, the method comprising:
  scaling an input modulation signal in accordance with a scaling parameter and thereby generating a scaled modulation signal;
  applying the scaled modulation signal to the voltage-controlled oscillator;
  detecting changes in one or more parameters characterizing the voltage-controlled oscillator; and
  adjusting the scaling parameter in accordance with the changes in the one or more parameters;
  generating a detection signal by rectifying an input signal;
  providing a temperature-compensated reference signal; and
  providing a temperature-compensated output signal corresponding to a difference between the detection signal and the temperature-compensated reference signal.

14. The method of claim 13, further comprising:
  multiplying a frequency modulation signal by the scaling parameter to achieve a modified frequency modulation signal; and
  inputting the modified frequency modulation signal to a frequency modulation port of the voltage-controlled oscillator.

15. The method of claim 13, wherein the one or more parameters include a product of the frequency gain and a frequency modulation signal associated with the voltage-controlled oscillator.

16. A compensation apparatus for use with a phase-locked loop, the compensation apparatus comprising:
  a scaling network configured to scale an input modulation signal in accordance with a scaling parameter and thereby generate a scaled modulation signal, the scaled modulation signal being applied to a voltage-controlled oscillator of the phase-locked loop;
  a sensing network configured to detect changes in one or more parameters characterizing the voltage-controlled oscillator; and
  a calibration adjustment network configured to adjust the scaling parameter in accordance with the changes in the one or more parameters
  a peak detector circuit; and
  a swept capacitance circuit.

17. A compensation apparatus for use with a phase-locked loop, the compensation apparatus comprising:
  a scaling network configured to scale an input modulation signal in accordance with a scaling parameter and thereby generate a scaled modulation signal, the scaled modulation signal being applied to a voltage-controlled oscillator of the phase-locked loop;

a sensing network configured to detect changes in one or more parameters characterizing the voltage-controlled oscillator; and a calibration adjustment network configured to adjust the scaling parameter in accordance with the changes in the one or more parameters, wherein the calibration adjustment network comprises a first transistor configured to receive a constant current, wherein the constant current charges the capacitance of the first transistor to a first series of capacitance levels that is related to a second series of capacitance levels associated with a second transistor belonging to the voltage-controlled oscillator.

18. A compensation apparatus for use with a phase-locked loop, the compensation apparatus comprising:

a scaling network configured to scale an input modulation signal in accordance with a scaling parameter and thereby generate a scaled modulation signal, the scaled modulation signal being applied to a voltage-controlled oscillator of the phase-locked loop;

a sensing network configured to detect changes in one or more parameters characterizing the voltage-controlled oscillator; and a calibration adjustment network configured to adjust the scaling parameter in accordance with the changes in the one or more parameters, wherein the calibration adjustment network comprises a detector component responsive to an input signal, the detector component including a transistor which rectifies the input signal so as to generate a detection signal.

* * * * *